(12) United States Patent
Fujita et al.

(10) Patent No.: US 8,654,809 B2
(45) Date of Patent: Feb. 18, 2014

(54) QUANTUM CASCADE LASER

(75) Inventors: Kazuue Fujita, Hamamatsu (JP); Masamichi Yamanishi, Hamamatsu (JP); Tadataka Edamura, Hamamatsu (JP); Naota Akikusa, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/782,255

(22) Filed: May 18, 2010

(65) Prior Publication Data
US 2011/0026556 A1   Feb. 3, 2011

(30) Foreign Application Priority Data
Jul. 31, 2009   (JP) ................ P2009-179531

(51) Int. Cl.
*H01S 5/00* (2006.01)
(52) U.S. Cl.
USPC ............................................ 372/46.01
(58) Field of Classification Search
None
See application file for complete search history.

(56) References Cited

U.S. PATENT DOCUMENTS

| | | | |
|---|---|---|---|
| 5,457,709 A | 10/1995 | Capasso et al. | |
| 5,745,516 A | 4/1998 | Capasso et al. | |
| 6,148,012 A * | 11/2000 | Capasso et al. | 372/45.012 |
| 6,324,199 B1 * | 11/2001 | Capasso et al. | 372/45.01 |
| 6,751,244 B2 | 6/2004 | Faist et al. | |
| 6,922,427 B2 | 7/2005 | Faist et al. | |
| 2006/0039431 A1 * | 2/2006 | Sekiguchi et al. | 372/44.01 |

FOREIGN PATENT DOCUMENTS

| | | |
|---|---|---|
| JP | 08-279647 | 10/1996 |
| JP | 10/004242 | 1/1998 |
| JP | 10/144995 | 5/1998 |
| JP | 2000-012983 | 1/2000 |
| JP | 2000-151026 | 5/2000 |
| JP | 2004-247492 | 9/2004 |
| JP | 2008-060396 | 3/2008 |
| JP | 2008-177366 | 7/2008 |
| JP | 2009-152508 | 7/2009 |
| WO | 2008/087754 | 7/2008 |

OTHER PUBLICATIONS

M. Beck, et al., "Continuous Wave Operation of a Mid Infrared Semiconductor Laser at Room Temperature", Science vol. 295, Jan. 2002, p. 301-p. 305.

(Continued)

*Primary Examiner* — Jessica Stultz
*Assistant Examiner* — Sean Hagan
(74) *Attorney, Agent, or Firm* — Drinker Biddle & Reath LLP

(57) ABSTRACT

A quantum cascade laser is configured to include a semiconductor substrate and an active layer which is provided on the substrate and has a cascade structure formed by multistage-laminating unit laminate structures 16 each including an emission layer 17 and an injection layer 18. The unit laminate structure 16 has, in its subband level structure, a first emission upper level $L_{up1}$, a second emission upper level $L_{up2}$ of an energy higher than the first emission upper level, an emission lower level $L_{low}$, and a relaxation level $L_r$ of an energy lower than the emission lower level, light is generated by intersubband transitions of electrons from the first and second upper levels to the lower level, and electrons after the intersubband transitions are relaxed from the lower level to the relaxation level and injected from the injection layer 18 into an emission layer 17b of a subsequent stage via the relaxation level. Accordingly, a quantum cascade laser capable of preferably obtaining emission in a broad wavelength range is realized.

4 Claims, 14 Drawing Sheets

(56) References Cited

OTHER PUBLICATIONS

J.S. Yu et al., "High-Power Continuous Wave Operation of a 6 μm Quantum-Cascade Laser at Room Temperature", Appl. Phys. Lett. vol. 83, No. 13, Sep. 2003, p. 2503-p. 2505.

A. Evans et al., "Continuous Wave Operation λ ~ 4.8 μm Quantum-Cascade Lasers at at Room Temperature", Appl. Phys. Lett. vol. 85, No. 12, Sep. 2004, p. 2166-p. 2168.

A. Tredicucci et al., "A Multiwavelength Semiconductor Laser", Nature vol. 396, Nov. 1998, p. 350-p. 353.

A Wittmann et al., "Heterogeneous High-Performance Quantum-Cascade Laser Sources for Broad-Band Tuning", IEEE J. Quantum Electron, vol. 44, No. 11, Nov. 2008, p. 1083-p. 1088.

A Wittmann et al., " High-Performance Bound-to-Continuum Quantum-Cascade Laser for Broad-Gain Applications", IEEE J. Quantum Electron, vol. 44, No. 1, Jan. 2008, p. 36-p. 40.

R. Maulini et al., "Broadband Tuning of External Cavity Bound-to-Continuum Quantum-Cascade Lasers", Appl. Phys. Lett., vol. 84, No. 10, Mar. 2004, p. 1659-p. 1661.

F. Capasso et al., "High-Performance Superlattice Quantum Cascade Lasers", IEEE J. of Selected Topics in Quantum Electronics, vol. 5, No. 3, May/Jun. 1999, p. 792-p. 807.

A. Tredicucci et al., "High-Powered inter-miniband lasing in intrinsic superlattices", Appl. Phys. Lett. vol. 72, No. 19, May 1998, p. 2388-p. 2390.

\* cited by examiner

Fig.6

| SEMICONDUCTOR LAYER | | COMPOSITION | LAYER THICKNESS | DOPING |
|---|---|---|---|---|
| INJECTION BARRIER LAYER 171 | | InAlAs | 3.7nm | undoped |
| EMISSION LAYER 17 | WELL LAYER 161 | InGaAs | 3.1nm | undoped |
| | BARRIER LAYER 172 | InAlAs | 2.7nm | undoped |
| | 162 | InGaAs | 7.5nm | undoped |
| | 173 | InAlAs | 0.7nm | undoped |
| | 163 | InGaAs | 5.8nm | undoped |
| | 174 | InAlAs | 1.5nm | undoped |
| | 164 | InGaAs | 5.2nm | undoped |
| EXIT BARRIER LAYER 191 | | InAlAs | 2.0nm | undoped |
| INJECTION LAYER 18 | WELL LAYER 181 | InGaAs | 4.1nm | undoped |
| | BARRIER LAYER 192 | InAlAs | 1.5nm | undoped |
| | 182 | InGaAs | 3.8nm | undoped |
| | 193 | InAlAs | 1.6nm | undoped |
| | 183 | InGaAs | 3.5nm | undoped |
| | 194 | InAlAs | 1.7nm | Si doped: $2 \times 10^{17}/cm^3$ |
| | 184 | InGaAs | 3.4nm | Si doped: $2 \times 10^{17}/cm^3$ |
| | 195 | InAlAs | 2.0nm | Si doped: $2 \times 10^{17}/cm^3$ |
| | 185 | InGaAs | 3.4nm | Si doped: $2 \times 10^{17}/cm^3$ |
| | 196 | InAlAs | 2.3nm | undoped |
| | 186 | InGaAs | 3.4nm | undoped |
| | 197 | InAlAs | 2.8nm | undoped |
| | 187 | InGaAs | 3.3nm | undoped |

Fig.14

| SEMICONDUCTOR LAYER | | COMPOSITION | LAYER THICKNESS | DOPING |
|---|---|---|---|---|
| INJECTION BARRIER LAYER 271 | | InAlAs | 3.7nm | undoped |
| EMISSION LAYER 17 | WELL LAYER 261 | InGaAs | 3.1nm | undoped |
| | BARRIER LAYER 272 | InAlAs | 3.4nm | undoped |
| | 262 | InGaAs | 2.8nm | undoped |
| | 273 | InAlAs | 2.7nm | undoped |
| | 263 | InGaAs | 7.0nm | undoped |
| | 274 | InAlAs | 0.7nm | undoped |
| | 264 | InGaAs | 5.8nm | undoped |
| | 275 | InAlAs | 1.5nm | undoped |
| | 265 | InGaAs | 5.2nm | undoped |
| EXIT BARRIER LAYER 291 | | InAlAs | 2.0nm | undoped |
| INJECTION LAYER 18 | WELL LAYER 281 | InGaAs | 4.1nm | undoped |
| | BARRIER LAYER 292 | InAlAs | 1.5nm | undoped |
| | 282 | InGaAs | 3.8nm | undoped |
| | 293 | InAlAs | 1.6nm | undoped |
| | 283 | InGaAs | 3.5nm | undoped |
| | 294 | InAlAs | 1.7nm | Si doped: $2 \times 10^{17}/cm^3$ |
| | 284 | InGaAs | 3.4nm | Si doped: $2 \times 10^{17}/cm^3$ |
| | 295 | InAlAs | 2.0nm | Si doped: $2 \times 10^{17}/cm^3$ |
| | 285 | InGaAs | 3.4nm | Si doped: $2 \times 10^{17}/cm^3$ |
| | 296 | InAlAs | 2.3nm | undoped |
| | 286 | InGaAs | 3.4nm | undoped |
| | 297 | InAlAs | 2.8nm | undoped |
| | 287 | InGaAs | 3.3nm | undoped |

QUANTUM CASCADE LASER

BACKGROUND OF THE INVENTION

1. Field of the Invention

The present invention relates to a quantum cascade laser using intersubband transition in a quantum well structure.

2. Related Background Art

Light with a mid-infrared wavelength range (for example, wavelength of 5 to 30 μm) is an important wavelength range in the field of spectroscopy analysis. As a high-performance semiconductor light source in this wavelength range, in recent years, quantum cascade lasers (QCL) have gained attention (for example, refer to Patent Documents 1 to 8 and Non-Patent Documents 1 to 7).

A quantum cascade laser is a monopolar type laser element which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers.

Patent Document 1: U.S. Pat. No. 5,457,709
Patent Document 2: U.S. Pat. No. 5,745,516
Patent Document 3: U.S. Pat. No. 6,751,244
Patent Document 4: U.S. Pat. No. 6,922,427
Patent Document 5: Japanese Patent Application Laid-Open No. H8-279647
Patent Document 6: Japanese Patent Application Laid-Open No. 2008-177366
Patent Document 7: Japanese Patent Application Laid-Open No. 2008-60396
Patent Document 8: Japanese Patent Application Laid-Open No. H10-4242
Non-Patent Document 1: M. Beck et al., "Continuous Wave Operation of a Mid-Infrared Semiconductor Laser at Room Temperature," Science Vol. 295 (2002), pp. 301-305
Non-Patent Document 2: J. S. Yu et al., "High-Power Continuous-Wave Operation of a 6 μm Quantum-Cascade Laser at Room Temperature," Appl. Phys. Lett. Vol. 83 (2003), pp. 2503-2505
Non-Patent Document 3: A. Evans et al., "Continuous-Wave Operation of λ~4.8 μm Quantum-Cascade Lasers at Room Temperature," Appl. Phys. Lett. Vol. 85 (2004), pp. 2166-2168
Non-Patent Document 4: A. Tredicucci et al., "A Multiwavelength Semiconductor Laser," Nature Vol. 396 (1998), pp. 350-353
Non-Patent Document 5: A. Wittmann et al., "Heterogeneous High-Performance Quantum-Cascade Laser Sources for Broad-Band Tuning," IEEE J. Quantum Electron. Vol. 44 (2008), pp. 1083-1088
Non-Patent Document 6: A. Wittmann et al., "High-Performance Bound-To-Continuum Quantum-Cascade Lasers for Broad-Gain Applications," IEEE J. Quantum Electron. Vol. 44 (2008), pp. 36-40
Non-Patent Document 7: R. Maulini et al., "Broadband Tuning of External Cavity Bound-to-Continuum Quantum-Cascade Lasers," Appl. Phys. Lett. Vol. 84 (2004), pp. 1659-1661

SUMMARY OF THE INVENTION

In the above-described quantum cascade laser, when laser oscillation was successfully realized for the first time, the element operating temperature is limited to ultralow temperatures, however, in 2002, M. Beck et al. achieved a room-temperature CW operation at an oscillation wavelength of 9.1 μm (Non-Patent Document 1: M. Beck et al., Science Vol. 295 (2002) pp. 301-305). Thereafter, the group of M. Razeghi et al. also achieved a room-temperature CW operation at oscillation wavelengths of 6 μm and 4.8 μm (Non-Patent Document 2: J. S. Yu et al., Appl. Phys. Lett. Vol. 83 (2003) pp. 2503-2505, Non-Patent Document 3: A. Evans et al., Appl. Phys. Lett. Vol. 85 (2004) pp. 2166-2168). At present, room-temperature continuous oscillation in a broad wavelength range of 3.8 to 11.5 μm has been achieved and has already reached the stage of practical use.

After room-temperature continuous oscillation of the quantum cascade laser was achieved, it has been attempted to manufacture a quantum cascade laser which realizes single-mode oscillation in a broad wavelength range by using a laser device in combination with an external cavity (EC). Further, a distributed feed back (DFB) type quantum cascade laser for a room-temperature CW operation capable of scanning a single wavelength has also been developed.

Here, to achieve single-mode oscillation in a broad wavelength range, an emission layer structure capable of emitting light in a broad wavelength range must be adopted. At present, in an emission layer structure of a quantum cascade laser which realizes a room-temperature CW operation (RT-CW), a structure in which the peak gain is regarded as important and the full width at half maximum (FWHM) of emission of electroluminescence (EL) is narrow is mainly used. When normal intersubband transition between single levels is used, although it depends on various conditions such as the wavelength, the emission half width is generally approximately 15 to 25 meV (for example, approximately 20 meV at a wavelength around 8 μm), and is approximately 120 to 200 cm$^{-1}$ in terms of wavenumber.

On the other hand, as an active layer structure of a quantum cascade laser with a broad emission half width of EL, an active layer structure using a chirped superlattice structure is proposed (Non-Patent Document 4: A. Tredicucci et al., Nature Vol. 396 (1998) pp. 350-353). In this structure, an emission upper level and an emission lower level relating to emission are formed as minibands each consisting of many levels (subbands), and emission by miniband-miniband electron transition is used. According to this superlattice structure, emission transition occurs from a plurality of levels in an emission upper miniband to a plurality of levels in an emission lower miniband, so that a wide emission half width is necessarily obtained.

However, in this structure, a miniband is used for the emission upper level, so that selective carrier injection into a specific level is difficult, and as a result, excellent performance as a laser device cannot be obtained. The broad emission half width obtained in this superlattice structure is caused by transitions from a plurality of levels to a plurality of levels as described above, so that control of the emission transitions is difficult.

Specifically, the plurality of levels in the miniband are separated from each other by approximately 20 meV in terms of energies of the levels. Therefore, emission as a whole between the miniband and the miniband is superposition of some isolated emissions, and the intensities of the emissions are determined according to the transition intensities between levels depending on the operating electric field. Therefore, the emission spectrum obtained from the active layer structure with this superlattice becomes an inhomogeneous spectrum in which respective transitions between levels can be clearly separated as shown in Non-Patent Document 4 described above.

Thus, in an emission mode with a spectrum inhomogeneously spread, even if the emission half width is broad, in the case of installation in the above-described EC type or DFB type quantum cascade laser, the possibility of oscillation at a wavelength other than a selected wavelength cannot be eliminated. Therefore, the active layer structure using the superlattice is not suitable for an EC type or DFB type broadband single axial mode light source. In actuality, in Non-Patent Document 4, simultaneous oscillations at a plurality of wavelengths by using the superlattice active layer structure were confirmed, and a single axial mode operation is not realized.

On the other hand, as an emission layer structure realizing both of high performance and a broad emission band, there is a BTC (Bound to Continuum) active layer structure with a subband-miniband transition mode (Patent Document 4: U.S. Pat. No. 6,922,427). With the BTC structure, a broad emission half width which is 1.5 times as wide as that of other structures capable of performing a room-temperature CW operation is realized. Emission transition in this BTC structure is not miniband-miniband transition as in the superlattice structure, but is transition from a common single upper level, so that the gain is fixed to one emission transition concurrently with oscillation, and oscillation with a plurality of wavelengths does not occur.

At present, by combining BTC structures for two wavelengths, wavelength scanning in a pulse operation of an external cavity type quantum cascade laser (EC-QCL) is realized in a broad wavelength range of 292 cm$^{-1}$ (7.66 μm to 9.87 μm). In the CW operation, wavelength scanning with EC-QCL is also realized in a broadband of 201 cm$^{-1}$ (8.0 μm to 9.6 μm) (Non-Patent Document 5: A. Wittmann et al., IEEE J. Quantum Electron. Vol. 44 (2008) pp. 1083-1088).

However, in emission transition in the above-described BTC active layer structure, as described later, the emission half width (FWHM of EL) is greatly changed by the operation voltage, and this poses a problem in regard to stable wavelength scanning. Further, subband-miniband transition is used, so that control of the intensity of transition to each level (each subband) in a miniband is difficult, and emission transitioning to a level that does not contribute to oscillation also occurs.

The present invention has been made in order to solve the above-described problems, and an object is to provide a quantum cascade laser capable of preferably obtaining emission in a broad wavelength range.

In order to achieve the above-described object, a quantum cascade laser of the present invention includes: (1) a semiconductor substrate and (2) an active layer which is provided on the semiconductor substrate and has a cascade structure formed by alternately laminating quantum well emission layers and injection layers by multistage-laminating unit laminate structures each including the quantum well emission layer and the injection layer, (3) the unit laminate structure included in the active layer has, in its subband level structure, a first emission upper level, a second emission upper level as an energy level higher than the first emission upper level, a single emission lower level, and a relaxation level as an energy level lower than the emission lower level, (4) light is generated by intersubband transitions of electrons from the first emission upper level and the second emission upper level to the emission lower level in the quantum well emission layer, and electrons after intersubband transitions are relaxed from the emission lower level to the relaxation level, and injected from the injection layer into the quantum well emission layer of the unit laminate structure of the subsequent stage via the relaxation level.

In the quantum cascade laser described above, in the subband level structure in the unit laminate structure consisting of the emission layer and the injection layer, as levels relating to emission, two emission upper levels of the first and second emission upper levels and the single emission lower level are provided. Thus, by using two or more subbands as emission upper levels, emission in a broad wavelength range can be realized. In a level structure in which emission transitions from two upper levels are concentrated toward a single common lower level, by the design of the coupling strength between the first and second emission upper levels and the energy difference between the two levels, etc., characteristics such as the emission spectrum obtained by the emission transitions can be preferably controlled.

In the configuration described above, in the subband level structure thereof, in addition to the first and second emission upper levels and the emission lower level, the relaxation level of an energy lower than the emission lower level is provided. With this configuration, electrons after intersubband emission transitions in the quantum well emission layer are extracted from the emission lower level by relaxation to the relaxation level. Accordingly, a population inversion can be efficiently created in the emission layer. Thus, a quantum cascade laser capable of preferably obtaining emission in a broad wavelength range is realized. The subband level structure in the unit laminate structure as described above can be controlled by the design of the quantum well structure in the unit laminate structure constituting the active layer.

According to the quantum cascade laser of the present invention, in the subband level structure in the unit laminate structure constituting the active layer, as levels relating to emission, two emission upper levels of the first and second emission upper levels, the single emission lower level, and the relaxation level of an energy lower than the emission lower level are provided, light is generated by intersubband transitions of electrons from the first emission upper level and the second emission upper level to the emission lower level, and electrons after intersubband transitions are relaxed to the relaxation level from the emission lower level, and accordingly, emission in a wide wavelength range can be preferably obtained.

BRIEF DESCRIPTION OF THE DRAWINGS

FIG. 6 is a chart showing an example of a structure of a unit laminate structure of one period in the active layer.

FIG. 14 is a chart showing another example of a structure of a unit laminate structure of one period in the active layer.

DESCRIPTION OF THE PREFERRED EMBODIMENTS

Figure 1:
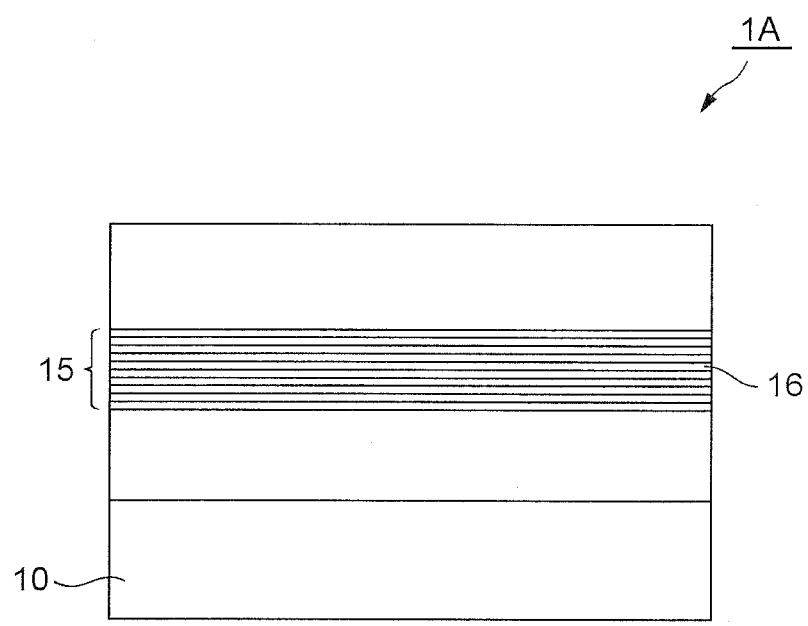
FIG. 1 is a view schematically showing a basic configuration of a quantum cascade laser.

Hereinafter, preferred embodiments of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

FIG. 1 is a view schematically showing a basic configuration of a quantum cascade laser of the present invention. A quantum cascade laser 1A of the present embodiment is a monopolar type laser element which generates light by using intersubband electron transition in a semiconductor quantum well structure. This quantum cascade laser 1A includes a semiconductor substrate 10 and an active layer 15 formed on the semiconductor substrate 10.

The active layer 15 has a cascade structure formed by alternately multistage-laminating quantum well emission layers to be used for generating light and electron injection layers to be used for injecting electrons into the emission layers. In detail, a semiconductor lamination structure consisting of a quantum well emission layer and an injection layer is defined as a unit laminate structure 16 of one period, and by multistage-laminating the unit laminate structures 16, an active layer 15 with a cascade structure is configured. The number of laminations of the unit laminate structures 16 each including the quantum well emission layer and the injection layer is appropriately designed, and for example, approximately several hundred. The active layer 15 is formed on the semiconductor substrate 10 directly or via another semiconductor layer.

Figure 2:
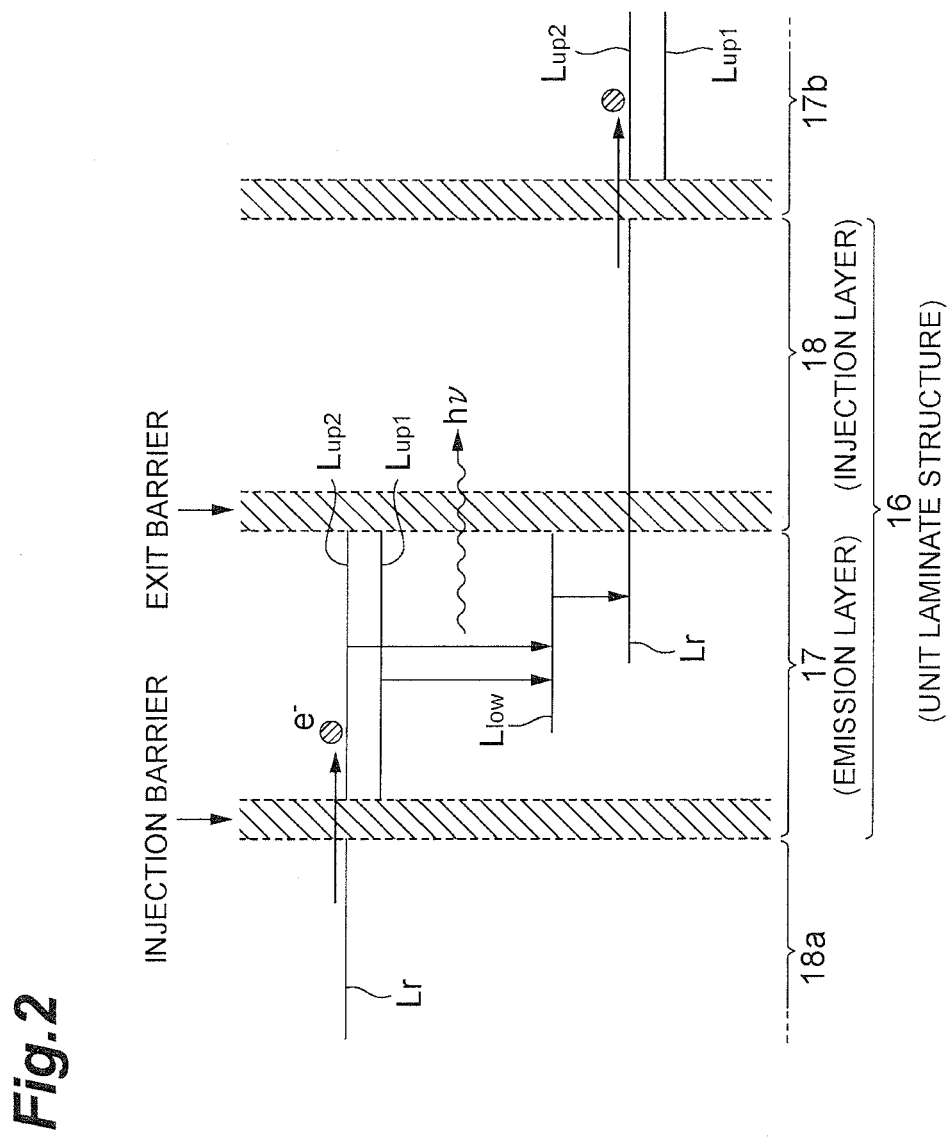
FIG. 2 is a diagram showing an example of a subband level structure in an active layer of the quantum cascade laser.

FIG. 2 is a diagram showing a subband level structure in the active layer of the quantum cascade laser shown in FIG. 1. As shown in FIG. 2, each of the plurality of unit laminate structures 16 included in the active layer 15 consists of a quantum well emission layer 17 and an electron injection layer 18. These emission layer 17 and injection layer 18 are respectively formed to have a predetermined quantum well structure including quantum well layers and quantum barrier layers as described later. Accordingly, in the unit laminate structure 16, a subband level structure which is an energy level structure using the quantum well structure is formed.

The unit laminate structure 16 constituting the active layer 15 in the quantum cascade laser 1A of the present embodiment has, in its subband level structure, as shown in FIG. 2, a first emission upper level $L_{up1}$, a second emission upper level $L_{up2}$ as an energy level higher than the first emission upper level, and a single emission lower level $L_{low}$, as levels relating to emission by intersubband transition. In this level structure, preferably, two emission upper levels $L_{up1}$ and $L_{up2}$ are designed so that the energy positions of the levels match with each other and the wave functions are coupled (anticrossing) under conditions of the operating electric field. In this case, these two upper levels behave like one emission upper level with an energy width.

In the subband level structure shown in FIG. 2, in addition to these two emission upper levels and one emission lower level, a relaxation level $L_r$ is provided as an energy level lower than the emission lower level $L_{low}$. This relaxation level $L_r$ is a level for extracting electrons after emission transitions from the emission lower level $L_{low}$, and preferably, the energy difference between the emission lower level $L_{low}$ and the relaxation level $L_r$ is designed to be an energy $E_{LO}$ of a longitudinal optical (LO) phonon. The relaxation level $L_r$ as a ground level in the injection layer 18 is preferably designed so as to be strongly coupled to the second emission upper level $L_{up2}$ in the emission layer 17b in the unit laminate structure of the subsequent stage under the condition of the operating electric field.

In the unit laminate structure 16 shown in FIG. 2, between the emission layer 17 and the injection layer 18a in the unit laminate structure of the preceding stage, an injection barrier layer for electrons to be injected from the injection layer 18a into the emission layer 17 is provided. Further, between the emission layer 17 and the injection layer 18, an exit barrier layer for electrons from the emission layer 17 to the injection layer 18 is provided. These barrier layers are provided as appropriate according to the specific lamination structure and the subband level structure of the active layer 15 including the emission layers 17 and the injection layers 18.

In this subband level structure, electrons $e^-$ from the relaxation level $L_r$ in the injection layer 18a of the preceding stage are injected into the emission layer 17 via the injection barrier, and accordingly, the second emission upper level $L_{up2}$ coupled to the relaxation level $L_r$ is strongly excited. At this time, via a high-speed scattering process of electron-electron scattering, etc., sufficient electrons are also supplied to the first emission upper level $L_{up1}$, and sufficient carriers are supplied to both of two emission upper levels $L_{up1}$ and $L_{up2}$.

Electrons injected into the first emission upper level $L_{up1}$ and the second emission upper level $L_{up2}$ emission-transit to the single and common emission lower level $L_{low}$, and at this time, light hv with a wavelength corresponding to the energy difference between the subband levels of the upper levels $L_{up1}$, $L_{up2}$ and the lower level $L_{low}$ is generated and emitted. Further, at this time, as described above, the two upper levels behave like one emission upper level with an energy width, so that an obtained emission spectrum becomes a spectrum homogeneously spread.

Electrons that transited to the emission lower level $L_{low}$ are relaxed to the relaxation level $L_r$ by a relaxation process such as LO phonon scattering. Thus, by pulling out electrons from the emission lower level $L_{low}$ by using the relaxation level $L_r$, between the two upper levels $L_{up1}$, $L_{up2}$ and the single lower level $L_{low}$, a population inversion for realizing laser oscillation is formed. Electrons relaxed from the emission lower level $L_{low}$ to the relaxation level $L_r$ are injected in a cascade manner into the emission upper levels $L_{up1}$ and $L_{up2}$ in the emission layer 17b of the subsequent stage from the relaxation level $L_r$ via the exit barrier and the injection layer 18.

By repeating these electron injection, emission transition, and relaxation in the plurality of unit laminate structures 16 constituting the active layer 15, light is generated in a cascade manner in the active layer 15. That is, by alternately laminating many quantum well emission layers 17 and injection layers 18, electrons successively move through the laminate structures 16 in a cascading manner, and at the time of intersubband transition in each laminate structure 16, light hv is generated. Further, this light is resonated by the optical resonator of the laser 1A, and accordingly, a laser beam with a predetermined wavelength is generated.

Effects of the quantum cascade laser 1A of the present embodiment will be described.

In the quantum cascade laser 1A shown in FIG. 1 and FIG. 2, in the subband level structure in the unit laminate structure 16 consisting of the emission layer 17 and the injection layer 18, as levels relating to emission, two emission upper levels of the first and second emission upper levels $L_{up1}$ and $L_{up2}$ and the single emission lower level $L_{low}$ are provided. Thus, by using two or more subbands as emission upper levels, emission in a broad wavelength range can be realized.

In the level structure of FIG. 2 in which emission transitions from the two upper levels $L_{up1}$ and $L_{up2}$ are concentrated toward the single and common lower level $L_{low}$, by the design of specific conditions of the level structure, for example, the coupling strength between the first and second emission upper levels and the energy difference between the two levels, characteristics of the emission spectrum, etc., obtained by emission transitions can be preferably controlled.

In particular, when the design is made so that the wave functions of the two emission upper levels $L_{up1}$ and $L_{up2}$ are strongly coupled under conditions of the operating electric field, these two upper levels behave like one emission upper level with an energy width as described above. In this case, an obtained emission spectrum does not become an inhomogeneous spectrum as in the case of a superlattice structure, but becomes a homogeneously spread spectrum. This emission spectrum is suitable for, for example, a broadband single axial mode light source of an EC type or DFB type, etc. As commonly known in ordinary semiconductor lasers, due to high-speed electron-electron scattering between levels, hole burning of a gain spectrum does not occur at the time of laser oscillation, and therefore, single axial mode oscillation can be maintained.

In the subband level structure shown in FIG. 2, in addition to the first and second emission upper levels and the emission lower level described above, a relaxation level $L_r$ of an energy lower than the emission lower level is provided. With this configuration, electrons after intersubband emission transitions in the quantum well emission layer 17 are pulled out from the emission lower level $L_{low}$ by relaxation to the relaxation level $L_r$. Accordingly, an inverted population can be efficiently formed in the emission layer 17. A quantum cascade laser 1A capable of preferably obtaining emission in a broad wavelength range can be thus realized.

The subband level structure in the unit laminate structure 16 described above can be controlled by the design of the quantum well structure in the unit laminate structure 16 constituting the active layer 15. Among the levels relating to emission, the energy interval between the two levels of the first and second emission upper levels $L_{up1}$ and $L_{up2}$ is preferably designed to be smaller than the energy of an LO phonon. Accordingly, intersubband emission transitions using the two emission upper levels and one emission lower level can be preferably realized.

Here, more generally, the emission upper level in the subband level structure of the unit laminate structure 16 can be configured to have a plurality (two or three or more) of emission upper levels including at least the first emission upper level $L_{up1}$ and the second emission upper level $L_{up2}$. Further, in this configuration, concerning emission intensities of intersubband transitions from the respective plurality of emission upper levels to the emission lower level $L_{low}$, the weakest emission preferably has an emission intensity not less than ⅕ of that of the most intense emission. In this case, as described above, a configuration in which a plurality of emission upper levels behave like one emission upper level with an energy width as its whole can be reliably realized. Accordingly, in emission output from the quantum cascade laser, more homogeneously spread emission spectrum can be obtained.

The energy width (energy difference between the highest energy level and the lowest energy level) of the whole of the plurality of emission upper levels including at least the first and second emission upper levels is preferably designed to be smaller than the energy of an LO phonon. Accordingly, excellent characteristics can be obtained in emission transitions from the plurality of emission upper levels to the emission lower level. When the plurality of emission upper levels are the two levels of the first and second emission upper levels, the above-described condition corresponds to designing of the energy interval between these two levels to be smaller than the energy of an LO phonon. Here, when the emission energy interval is large, the transitions can be separated, and for example, at a room temperature, they clearly and inhomogeneously spread over approximately 25 to 30 meV. When the number of emission upper levels is three or more, if the energy width becomes wider, this may pose a problem in injection efficiency from the injection layer to the emission upper level or uniform distribution of electrons etc. On the other hand, as described above, by designing the energy width of the whole of the plurality of emission upper levels to be smaller than the energy of an LO phonon, excellent characteristics can be obtained.

In the configuration described above with a plurality of emission upper levels, electrons from the relaxation level $L_r$ of the injection layer 18a of the preceding stage are preferably injected into an energy level except for the lowest energy level among the plurality of emission upper levels. Accordingly, the energy dependence of the carrier distribution in an upper miniband consisting of the plurality of emission upper levels can be uniformized.

For extracting electrons from the emission lower level $L_{low}$, in the unit laminate structure 16, electrons after intersubband transitions are preferably relaxed from the emission lower level $L_{low}$ to the relaxation level $L_r$ by LO phonon scattering. Thus, in this configuration in which the energy difference between the emission lower level and the relaxation level are designed to correspond to the energy $E_{LO}$ of an LO phonon, electrons after intersubband emission transitions in the emission layer 17 are extracted at a high speed from the emission lower level via LO phonon scattering. Therefore, efficient formation of a population inversion in the emission layer 17 and a corresponding reduction in the threshold of the laser operation can be realized.

The structure for extracting electrons from the emission lower level $L_{low}$ in the subband level structure of the unit laminate structure 16 included in the active layer 15 is not limited to the configuration in which the relaxation level $L_r$ consisting of a single subband is provided, and various configurations can be used. As an example of this configuration, a double phonon resonance structure which pulls out electrons by two-step LO phonon scattering to the relaxation level $L_r$ can be used.

Alternatively, as a structure for extracting electrons from the emission lower level $L_{low}$, in the subband level structure of the unit laminate structure 16, a phonon resonance miniband relaxation (SPC: Single Phonon Resonance-Continuum) active layer structure provided with a relaxation miniband functioning as a relaxation level may also be used (Patent Document 6: Japanese Patent Application Laid-Open No. 2008-177366). This active layer structure has been developed as a unique device structure of a quantum cascade laser by the inventor of the present application.

Figure 3:
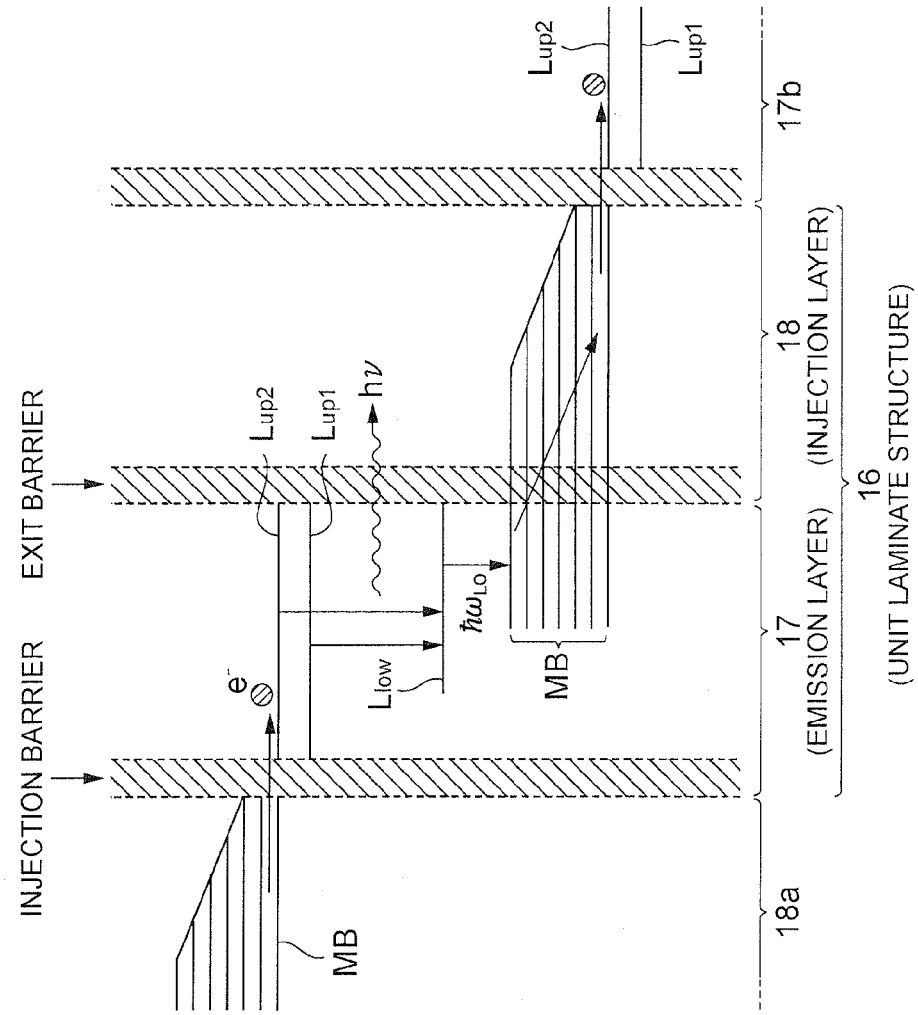
FIG. 3 is a diagram showing another example of a subband level structure in the active layer of the quantum cascade laser.

FIG. 3 is a diagram showing another example of a subband level structure in the active layer of the quantum cascade laser shown in FIG. 1. FIG. 3 shows a level structure when the above-described SPC structure is used as the structure for extracting electrons. In the subband level structure shown in FIG. 3, the first emission upper level $L_{up1}$, the second emission upper level $L_{up2}$, and the emission lower level $L_{low}$, are the same as those of the level structure shown in FIG. 2.

The unit laminate structure 16 in this configuration example has, in its subband level structure, in addition to the first and second emission upper levels $L_{up1}$ and $L_{up2}$ and the emission lower level $L_{low}$, a relaxation miniband MB consisting of a plurality of levels (a plurality of subbands) which are energy levels lower than the emission lower level $L_{low}$ and functions as relaxation levels. This miniband MB is designed so that the energy difference between the emission lower level $L_{low}$ and the miniband MB becomes the energy $E_{LO}$ of an LO phonon.

In this subband level structure, electrons that transited to the emission lower level $L_{low}$ are relaxed at a high speed to the relaxation miniband MB by LO phonon scattering, and further relaxed at a high speed in the miniband MB. Thus, by extracting electrons at a high speed from the emission lower level $L_{low}$ via LO phonon scattering and relaxation in a miniband, a population inversion for realizing laser oscillation is formed between the two upper levels $L_{up1}$, $L_{up2}$ and the single lower level $L_{low}$.

Further, in this level structure, the relaxation miniband MB has a band structure in which, as shown in FIG. 3, a miniband in the quantum well emission layer 17 and a miniband in the injection layer 18 are coupled. In this configuration, electrons relaxed from the emission lower level $L_{low}$ to the relaxation miniband MB are injected in a cascade manner from the miniband MB into the emission upper levels $L_{up1}$ and $L_{up2}$ of the emission layer 17b of the subsequent stage via the exit barrier and the injection layer 18.

In the configuration shown in FIG. 3, in the subband level structure of the unit laminate structure 16, a relaxation miniband MB including energy levels lower than the emission lower level $L_{low}$ is provided. Further, a level structure is configured so that the energy difference between the emission lower level $L_{low}$ and the relaxation miniband MB corresponds to the energy $E_{LO}$ of an LO phonon, and electrons after intersubband transitions are relaxed by LO phonon scattering from the emission lower level $L_{low}$ to the relaxation miniband MB, and injected from the injection layer 18 into the quantum well emission layer 17b of the unit laminate structure of the subsequent stage via the miniband MB.

In this SPC structure, electrons after intersubband emission transitions in the emission layer 17 are pulled out at a high speed from the emission lower level $L_{low}$ via LO phonon scattering and relaxation in the miniband MB. Therefore, efficient formation of a population inversion in the emission layer 17 and a corresponding reduction in the threshold of the laser operation are realized, and a laser device with especially improved laser operation performance can be realized.

By using the miniband MB including a plurality of subbands for relaxation of electrons after intersubband transitions, the design of a relaxation structure for electrons from the emission lower level $L_{low}$ is made easy, and stable characteristics in manufacturing of the laser device and improvement in yield can be realized. This subband level structure can be controlled by the design of the quantum well structure in the unit laminate structure 16 constituting the active layer 15 as in the case of the first and second emission upper levels and the emission lower level.

Here, for the emission lower level $L_{low}$ in the subband level structure shown in FIG. 3, a configuration in which one subband in the relaxation miniband MB (a subband of the highest energy in the miniband MB) is separated to the higher energy side by the energy $E_{LO}$ of an LO phonon from other subbands, and the separated level is used as the emission lower level $L_{low}$, can be used. Accordingly, a level structure including the emission lower level $L_{low}$ and the relaxation miniband MB can be preferably realized.

In the quantum well structure of the active layer 15, as shown in FIG. 2 and FIG. 3, an exit barrier layer is preferably provided between the emission layer 17 and the injection layer 18 in the unit laminate structure 16. Accordingly, leaking out of the wave functions of electrons from the injection layer 18 to the emission layer 17 can be suppressed, and the efficiency of the emission transitions in the emission layer 17 can be improved. That is, by suppressing the leaking-out of the wave functions of electrons, the optical transitions contributing to laser oscillation are reliably caused between the subbands of the first and second emission upper levels $L_{up1}$ and $L_{up2}$ and the lower level $L_{low}$, and carriers from the lower level $L_{low}$ relax to the relaxation level $L_r$ or the relaxation miniband MB through a relaxation process such as LO phonon scattering.

When the relaxation miniband MB is used in the subband level structure, as shown in FIG. 3, the relaxation miniband MB preferably has a band structure in which the miniband in the emission layer 17 and the miniband in the injection layer 18 are coupled. Thus, by strongly coupling the miniband of the emission layer 17 and the miniband of the injection layer 18, the electron tunneling time from the emission layer 17 to the injection layer 18 can be made very short.

Figure 4:
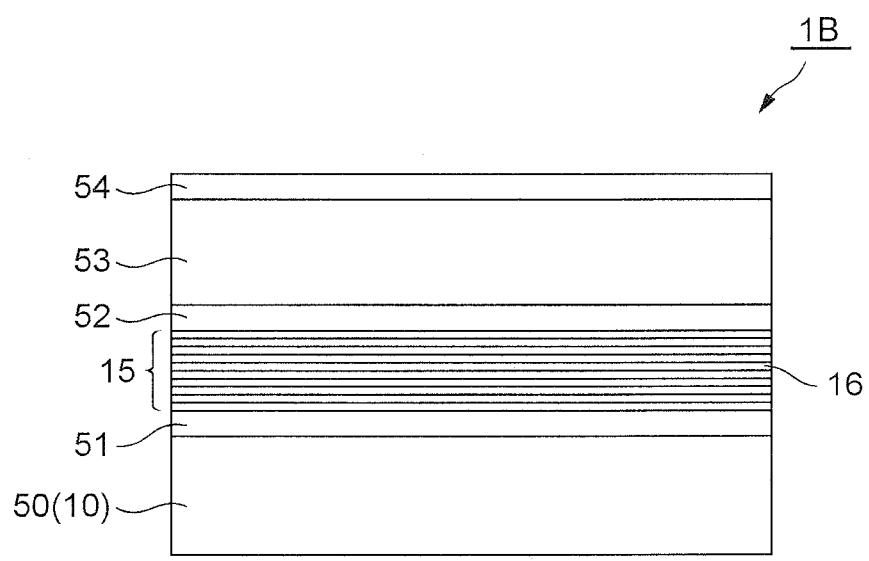
FIG. 4 is a view showing an example of a configuration of the quantum cascade laser.
Figure 5:
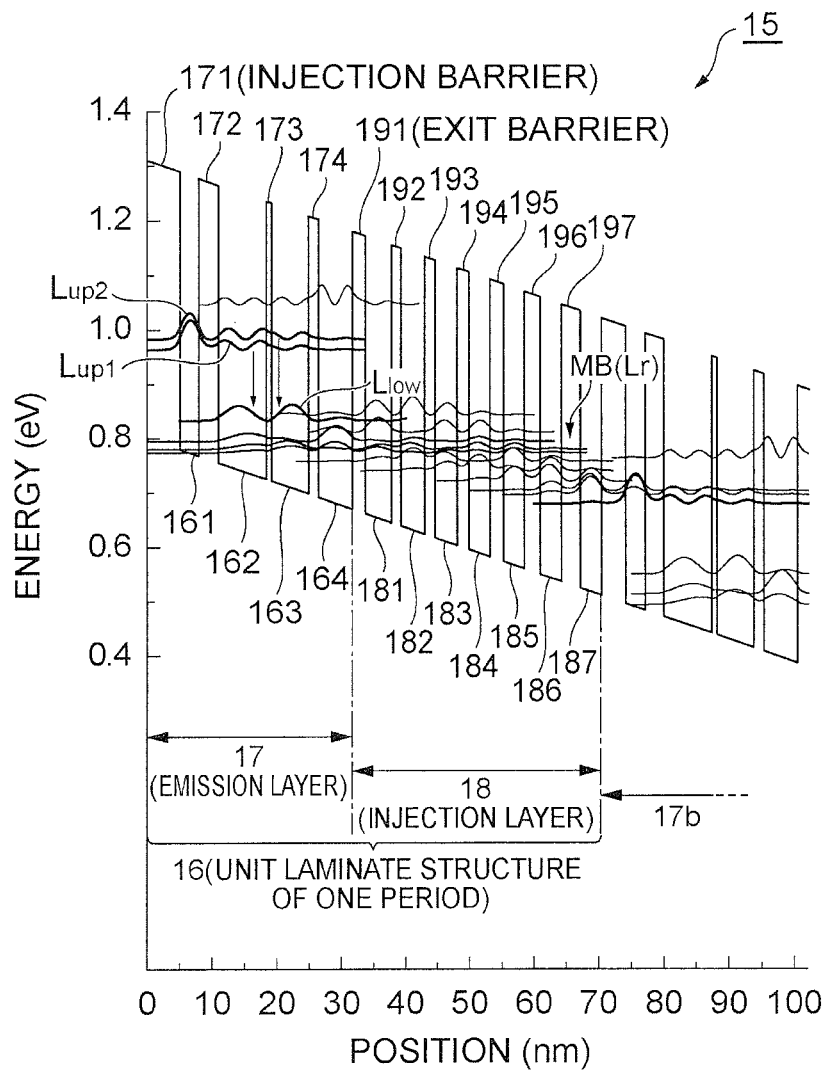
FIG. 5 is a diagram showing an example of a configuration of a unit laminate structure constituting the active layer.

The configuration of the quantum cascade laser of the present invention will be further described along with a specific example of a device structure including a quantum well structure in the active layer. FIG. 4 is a view showing an example of a specific configuration of the quantum cascade laser. FIG. 5 is a diagram showing an example of a configuration of a unit laminate structure constituting the active layer in the quantum cascade laser shown in FIG. 4.

The quantum well structure of the active layer 15 in this configuration example shows an example designed to be the oscillation wavelength to 8.7 μm (oscillation energy: 142 meV) and the operating electric field to 41 kV/cm. FIG. 5 shows a quantum well structure and a subband level structure of a part of the multistage repeated structure including the emission layers 17 and the injection layers 18 in the active layer 15. The device structure shown in FIG. 4 and FIG. 5 can be formed by, for example, crystal growth according to the molecular beam epitaxy (MBE) method or the metal organic vapor phase epitaxy (MOVPE) method.

In the semiconductor lamination structure of a quantum cascade laser 1B shown in FIG. 4, an n-type InP single crystal substrate 50 is used as a semiconductor substrate 10. Then, on this InP substrate 50, in order from the substrate side, an InGaAs lower core layer 51 with a thickness of 300 nm, an active layer 15 including multistage-laminated unit laminate structures 16, an InGaAs upper core layer 52 with a thickness of 300 nm, an InP cladding layer 53 with a thickness of 3.5 μm, and an InGaAs contact layer 54 with a thickness of 10 nm are laminated sequentially, and accordingly, a device structure of the quantum cascade laser 1B is formed.

In this configuration example, the active layer 15 is configured by laminating the unit laminate structures 16 each including the quantum well emission layer 17 and the electron injection layer 18 in 33 periods. The unit laminate structure 16 of one period is configured as shown in FIG. 5 as a quantum well structure formed by alternately laminating eleven quantum well layers 161 to 164 and 181 to 187 and eleven quantum barrier layers 171 to 174 and 191 to 197.

Among these semiconductor layers constituting the unit laminate structure 16, the quantum well layers are formed of $In_{0.53}Ga_{0.47}As$ layers. The quantum barrier layers are formed of $Al_{0.52}In_{0.48}As$ layers. Accordingly, the active layer 15 is configured by an InGaAs/InAlAs quantum well structure lattice-matched to the InP substrate 50.

In this unit laminate structure 16, as to the emission layer 17 and the injection layer 18, in the lamination structure shown in FIG. 5, the lamination portion consisting of the four well layers 161 to 164 and barrier layers 171 to 174 mainly functions as the emission layer 17. Further, the lamination portion consisting of the seven well layers 181 to 187 and barrier layers 191 to 197 mainly functions as the injection layer 18.

Among the semiconductor layers of the emission layer 17, the quantum barrier layer 171 of the first stage is positioned between the injection layer of the preceding stage and the emission layer 17, and serves as an injection barrier layer for electrons from the injection layer of the preceding stage to the emission layer 17. Similarly, among the semiconductor layers of the injection layer 18, the quantum barrier layer 191 of the first stage is positioned between the emission layer 17 and the injection layer 18 and serves as an exit barrier layer for electrons from the emission layer 17 to the injection layer 18. FIG. 6 shows an example of a detailed structure of the unit laminate structure 16 of one period in the active layer 15.

In this configuration, the unit laminate structure 16 has, in its subband level structure shown in FIG. 5, a first emission upper level (level 3) $L_{up1}$, a second emission upper level (level 4) $L_{up2}$, an emission lower level (level 2) $L_{low}$, and a relaxation miniband MB which is a relaxation level (level 1). In detail, in the level structure shown in FIG. 5, twelve levels contribute to a laser operation, and a plurality of levels correspond to the relaxation miniband MB functioning as a relaxation level. The layer thicknesses of the well layers and barrier layers in the emission layer 17 and the injection layer 18 are respectively designed based on quantum mechanics.

Specific design steps for the quantum well structure in the unit laminate structure 16 shown in FIG. 5 will be described. First, for providing an oscillation wavelength in a laser device, the energy interval between the first emission upper level (level 3) $L_{up1}$ and the emission lower level (level 2) $L_{low}$, and a structure for extracting electrons from the emission lower level are determined. In the subband level structure described above, the single emission lower level $L_{low}$ must be an isolated level, so that a miniband cannot be used for this. As for the structure for extracting and relaxing electrons from the emission lower level, in this configuration example, as described above, an SPC structure using the relaxation miniband MB is used.

The energy difference between the first emission upper level $L_{up1}$ and the emission lower level $L_{low}$ is determined according to the well widths of the well layers 161, 162, 163, and 164 and the thicknesses of the barrier layers 172, 173, and 174 in the emission layer 17, and the operating electric field. The operating electric field is calculated based on the estimated laminate structure film thickness and the amount of voltage drop per one period. In this configuration example, as described above, the operating electric field is designed to be 41 kV/cm.

Here, the well widths of the well layers 161 to 164 and the thicknesses of the barrier layers 172 to 174 which determine the emission wavelength cannot be determined independently because the wave functions of the levels are sensitively influenced by the quantum well layers and barrier layers. Therefore, the layer thicknesses of these semiconductor layers are quantum-mechanically determined by using numerical calculations. When determining a level position of the second emission upper level $L_{up2}$ at the next design step, the designed wavelength changes again. Therefore, here, first, configurations of the quantum well layers 162, 163, and 164 and the barrier layers 173 and 174 are roughly determined.

Next, the well width of the quantum well layer 161 for setting the second emission upper level (level 4) $L_{up2}$ is determined. The layer thickness of this well layer 161 inevitably becomes thinner than other well layers in the emission layer 17 because the ground level when the well layer 161 is present as a single quantum well layer corresponds to the second emission upper level $L_{up2}$. The first and second emission upper levels $L_{up1}$ and $L_{up2}$ must have wave functions coupled together and sufficiently overlap each other under the condition of the operating electric field. Therefore, the thickness of the well layer 161 is designed so that the ground level in the well layer 161 and the first emission upper level $L_{up1}$ become substantially equal in energy in the operating electric field.

The thickness of the barrier layer 172 determines the magnitude of anticrossing when the first and second emission upper levels $L_{up1}$ and $L_{up2}$ are coupled (the energy difference $\Delta E_{43}$ between the level 3 and the level 4 when they are completely coupled). The magnitude of anticrossing becomes greater as the barrier layer 172 becomes thinner, and becomes smaller as the barrier layer 172 becomes thicker.

The quantum cascade laser of the present invention realizes a broad emission half width by controlling transitions from the first and second emission upper levels $L_{up1}$ and $L_{up2}$ to the emission lower level $L_{low}$. Therefore, when the thickness of the barrier layer 172 is not proper, such a function is deteriorated. Specifically, when the barrier layer 172 is excessively thin, $\Delta E_{43}$ becomes larger, so that the transition to the emission lower level $L_{low}$ is biased to transition from either the first emission upper level $L_{up1}$ or the second emission upper level $L_{up2}$, and the emission half width becomes narrow. Even if emission is obtained without being biased, the emission spectrum thereof becomes inhomogeneous as in the case of interminiband transition.

On the other hand, when the barrier layer 172 is excessively thick, $\Delta E_{43}$ becomes excessively small, however, before this, if a barrier layer thicker than the injection barrier layer 171 is present in the cascade structure, carrier transportation becomes difficult, and the laser operation itself may be deteriorated. In this regard, the thickness of the barrier layer 172 must be properly designed to be thinner than the injection barrier layer 171. In the configuration example shown in FIG. 5, by designing the thickness of the barrier layer 172 to 2.7 nm, the energy difference $\Delta E_{43}$ between the emission upper levels $L_{up1}$ and $L_{up2}$ is calculated to be 15 meV.

In these design steps, the designed wavelength and differences between levels always change, however, by fine adjustments for each change, the thicknesses of all quantum well layers and barrier layers included in the emission layer 17 are determined. Finally, the layer thicknesses of the well layers 161, 162, 163, and 164 in the emission layer 17 were designed to be 3.1 nm, 7.5 nm, 5.8 nm, and 5.2 nm, respectively. The layer thicknesses of the barrier layers 172, 173, and 174 were designed to be 2.7 nm, 0.7 nm, and 1.5 nm, respectively.

Subsequently, the electron injection layer 18 is designed. In this configuration example, as a structure of this injection layer 18, a funnel injector (refer to Patent Document 8: Japanese Patent Application Laid-Open No. H10-4242) was used. By thus using a funnel injector, by making the energy width of the miniband MB narrower as the position becomes closer to the next period, the electron injection efficiency into the second emission upper level $L_{up2}$ can be increased. This level structure can be realized in the injection layer 18 by making the layer thickness of the quantum well layer thinner and the layer thickness of the barrier layer thicker as the position becomes closer to the emission layer 17b of the next period from the emission layer 17 side.

In the structure shown in FIG. 5, for designing the injection layer 18, the quantum well layer 187 adjacent to the emission layer 17b of the next period must be designed first. This is because the wave function of the level in the well layer 187 (the ground level in the injection layer 18 in the operating electric field) must follow the emission upper level in any electric field not more than the operating electric field.

In order to realize this state, the layer thickness of the well layer 187 must be slightly thicker (approximately several Å) than the well layer 161. In this configuration example, while the well layer 161 of the emission layer 17 has a thickness of 3.1 nm, the thickness of the well layer 187 of the injection layer 18 is designed to be 3.3 nm. Accordingly, by electron injection from the relaxation miniband MB, the second emission upper level $L_{up2}$ can be excited, and a wide emission half width can be realized.

Here, for example, considering a case where the well layer 187 is designed to be approximately 6 Å (0.6 nm, 2 atomic layers) thicker than the well layer 161, under conditions of a low electric field, the relaxation level in the well layer 187 not only becomes an energy lower than the second emission upper level $L_{up2}$ in the well layer 161, but is also positioned at an energy even lower than the first emission upper level $L_{up1}$. In this level structure, when approaching the operating electric field, electrons are injected into the first emission upper level $L_{up1}$ first, and it becomes difficult to obtain a broad emission half width.

After determining the layer thickness of the well layer 187, according to the same method as conventionally, layer thicknesses of other quantum well layers and barrier layers in the injection layer 18 are determined. First, the thickness of the exit barrier layer 191 adjacent to the emission layer 17 is determined. If the exit barrier layer 191 is excessively thick, the electron flow from the inside of the emission layer 17 to the injection layer 18 is lost, however, if the exit barrier layer is excessively thin, it is strongly coupled to and greatly influences the wave function in the emission layer 17, so that the exit barrier layer must be carefully designed.

Among the semiconductor layers constituting the injection layer 18, the thicknesses of the well layers and the barrier layers on the exit barrier layer 191 side are designed so that all of the electrons from the levels in the emission layer 17 can be transported to a miniband formed in the injection layer 18. On the other hand, concerning the thicknesses of the well layers and the barrier layers on the injection barrier layer 171 side of the next period, the relaxation miniband MB must be sufficiently narrowed so that electrons from the injection layer 18 are injected only into the second emission upper level $L_{up2}$ of the next period and are not injected into levels on the higher energy side.

As a result of design by considering the above-described points, the layer thicknesses of the well layers 181 to 187 in the injection layer 18 were designed to be 4.1 nm, 3.8 nm, 3.5 nm, 3.4 nm, 3.4 nm, 3.4 nm, and 3.3 nm, respectively. The layer thicknesses of the barrier layers 191 to 197 were designed to be 2.0 nm, 1.5 nm, 1.6 nm, 1.7 nm, 2.0 nm, 2.3 nm, and 2.8 nm, respectively.

Finally, the layer thickness of the injection barrier layer 171 in the quantum well emission layer 17 is determined. This barrier layer 171 determines the strengths of couplings of the periods in the cascade structure of the multistage unit laminate structures 16, and determines an applicable maximum current. The strength of coupling of wave functions is determined by the anticrossing gap, and, in this configuration example, the anticrossing gap was designed to be 7.3 meV, and the design was made so that a current equivalent to that in conventional techniques is applicable. In this case, the thickness of the injection barrier layer 171 is 3.7 nm.

The characteristics, etc., of the quantum cascade laser according to the configuration example designed as described above will be described with reference to FIG. 7 to FIG. 12.

Figure 7:
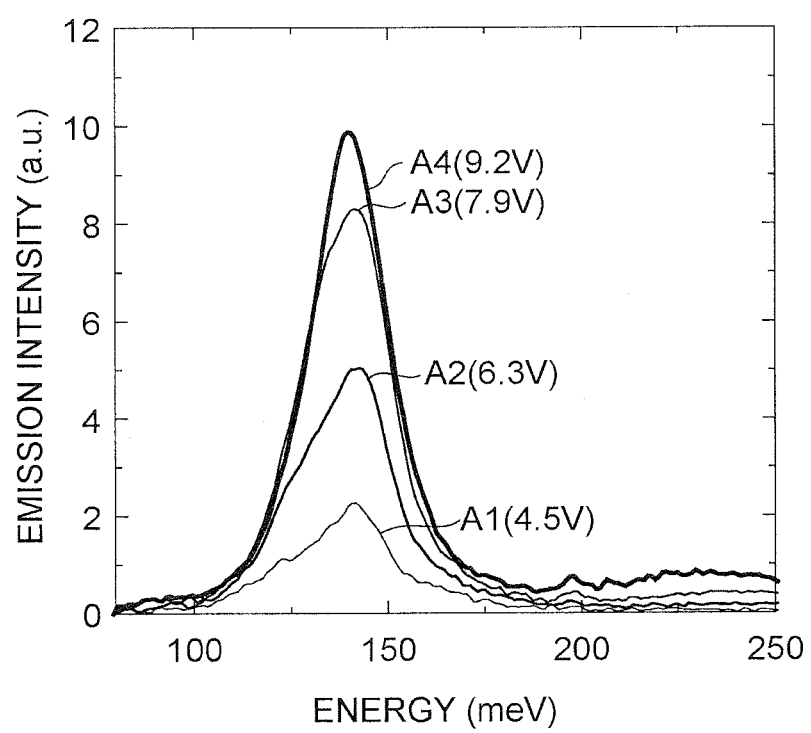
FIG. 7 is a graph showing emission spectra obtained with the quantum cascade laser.

FIG. 7 is a graph showing operating voltage dependence of the emission spectrum obtained with the quantum cascade laser. In this graph, the horizontal axis indicates the emission energy (meV), and the vertical axis indicates the emission intensity (a.u.). Here, an operation example in which the operation temperature is set to 300K, the repetition frequency is set to 100 kHz, and the pulse width is set to 500 nsec is shown. The graphs A1, A2, A3, and A4 show emission spectra when the applied voltage is 4.5V, 6.3V, 7.9V, and 9.2V, respectively. As shown by these graphs, by adopting the above-described level structure in the active layer, a broad emission half width is obtained in the emission spectrum.

Figure 8:
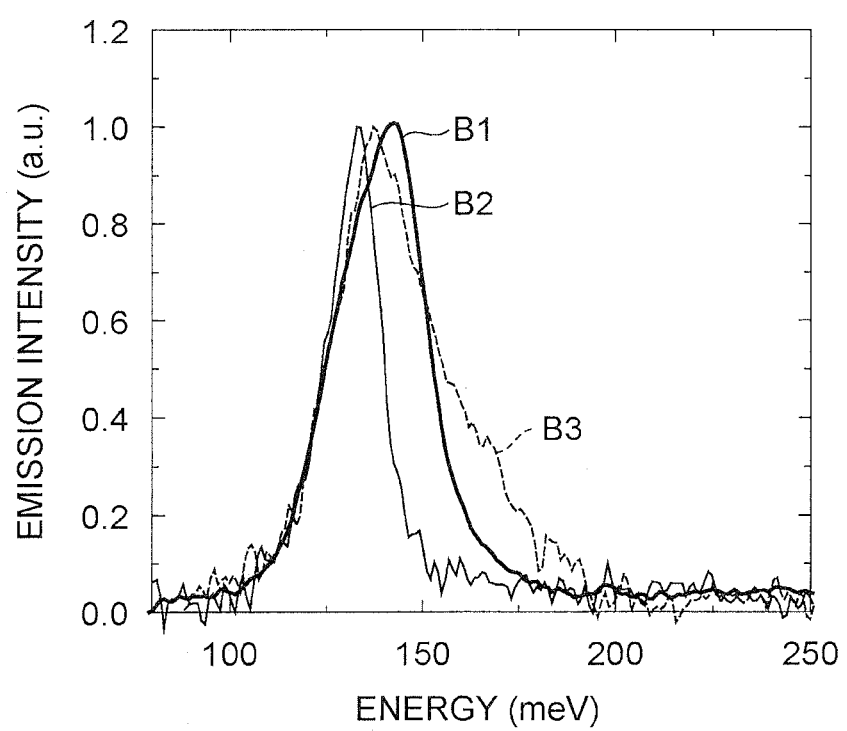
FIG. 8 is a graph showing emission spectra obtained with the quantum cascade laser.

FIG. 8 is a graph showing emission spectra obtained with the quantum cascade lasers with various structures. In this graph, the graph B1 shows an emission spectrum when the active layer structure of the present invention according to the configuration example described above is used. The graph B2 shows an emission spectrum when a conventional SPC structure including a single emission upper level is used. The graph B3 shows an emission spectrum when a BTC structure is used.

In FIG. 8, comparing the graphs B1 and B2, in the graph B1 of the above-described novel structure, the observed emission half width (FWHM) is up to 29.5 meV, and a very broad emission half width is realized as compared with the emission half width of 17 meV in the conventional SPC structure shown in the graph B2. Further, comparing the graphs B1 and B3, the graph B3 of the BTC structure has a foot of the spectrum on the higher energy side, however, the graph B1 of the novel structure does not have such a foot of the spectrum. This means that the emission transition is controllable to only the transition between desired levels in the above-described novel structure.

Figure 9:
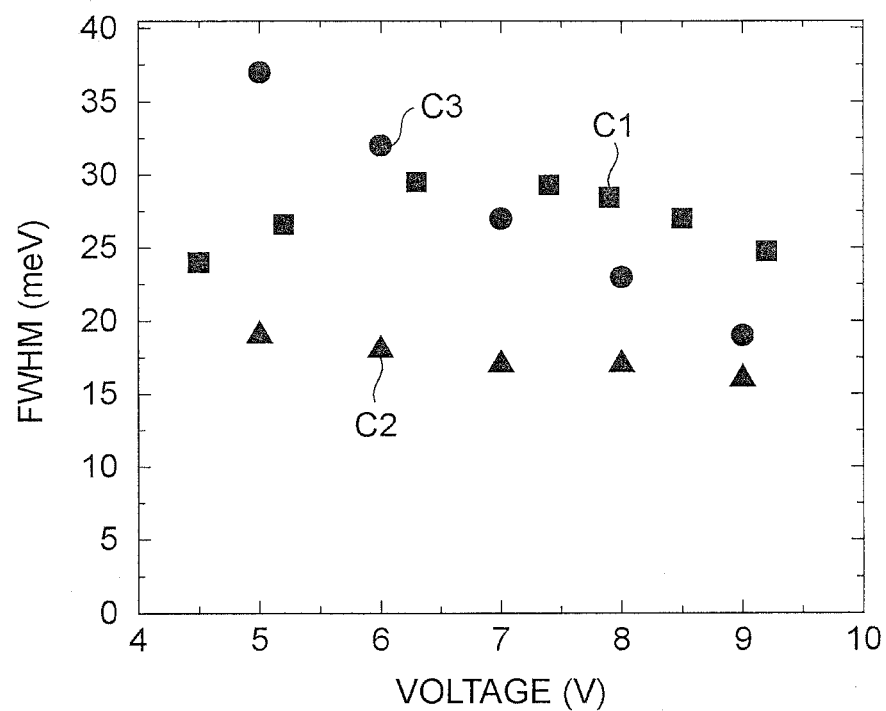
FIG. 9 is a graph showing voltage dependence of emission half width.

FIG. 9 is a graph showing voltage dependence of the emission half width. In this graph, the horizontal axis indicates an applied voltage (V), and the vertical axis indicates the FWHM (meV) corresponding to the emission half width. The graphs (data plots) C1, C2, and C3 show voltage dependences of the emission half width when the above-described novel structure, the conventional SPC structure, and the BTC structure are used, respectively. As shown by these graphs, in the BTC structure, the emission half width monotonically decreases with an increase in voltage, and on the other hand, in the novel structure, the emission half width is substantially constant in a range from operation voltage 5V to 8.5V. This means that the above-described novel structure has remarkably great superiority in regard to application to a laser device of a DFB type or EC type.

In the quantum cascade laser configured as described above, in the emission transitions from the first and second emission upper levels $L_{up1}$ and $L_{up2}$ to the emission lower level $L_{low}$, only when sufficient transition intensities are respectively obtained from the two levels $L_{up1}$ and $L_{up2}$, satisfactory characteristics and functions are obtained. Therefore, the two levels must be always sufficiently coupled in an operating state. When the coupling between the two levels becomes weak, the wave functions start to localize in different quantum well layers, and the dipole moments showing the transition intensities decrease.

Figure 10:
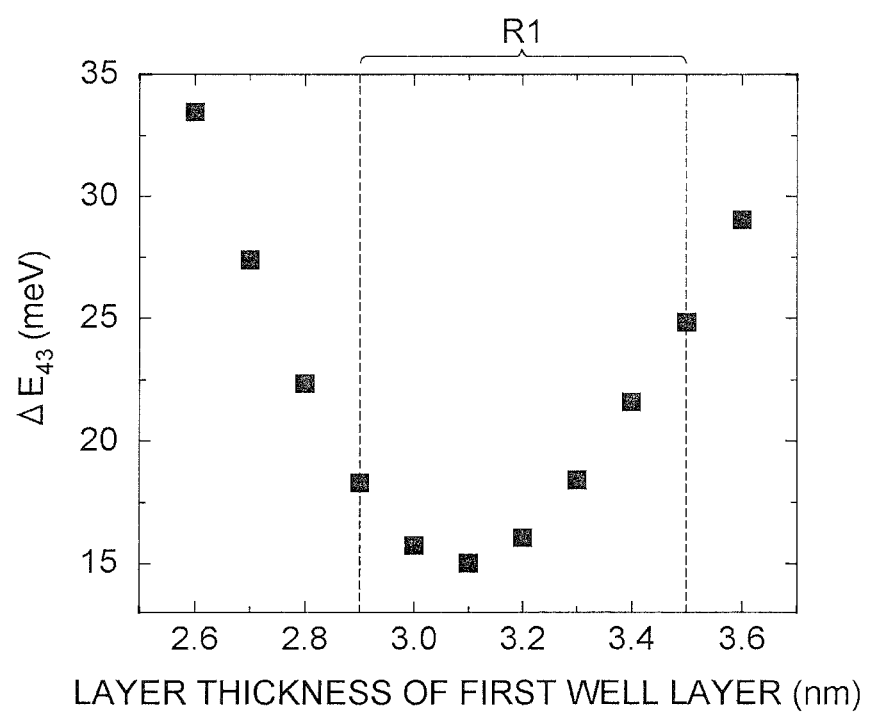
FIG. 10 is a graph showing dependence of an energy interval between the first emission upper level and the second emission upper level on the layer thickness of the first well layer.

Here, FIG. 10 is a graph showing dependence of the energy interval between the first emission upper level $L_{up1}$ and the second emission upper level $L_{up2}$ on the layer thickness of the first well layer. In this graph, the horizontal axis indicates the layer thickness of the first well layer 161 (nm) in the emission layer 17, and the vertical axis indicates the energy interval $\Delta E_{43}$ (meV) between the first and second emission upper levels.

Figure 11:
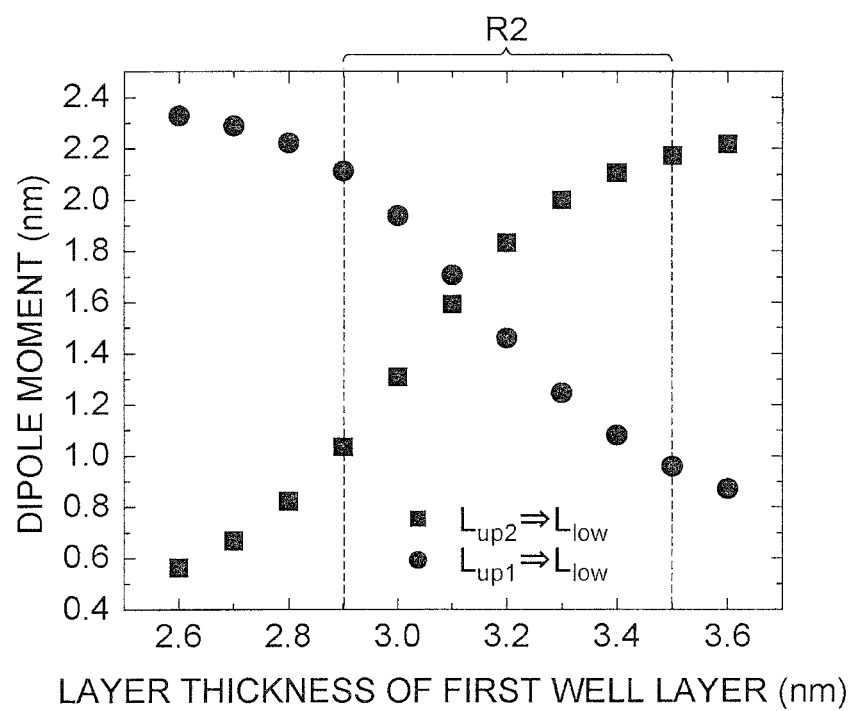
FIG. 11 is a graph showing dependences of dipole moments of emission transitions on the layer thickness of the first well layer.

FIG. 11 is a graph showing dependencies of the dipole moments of the emission transitions on the layer thickness of the first well layer. In this graph, the horizontal axis indicates the layer thickness of the first well layer 161 (nm) in the emission layer 17 as in FIG. 10, and the vertical axis indicates the dipole moment of the emission transition from the first emission upper level $L_{up1}$ to the emission lower level $L_{low}$, and the dipole moment of the emission transition from the second emission upper level $L_{up2}$ to the emission lower level $L_{low}$.

In the configuration example shown in FIG. 5 and FIG. 6, the layer thickness of the first well layer 161 in the emission layer 17 is 3.1 nm. On the other hand, as shown by the graph of FIG. 10, in both of the cases where the layer thickness of the well layer 161 is changed to be thicker than and thinner than the layer thickness of 3.1 nm of the configuration example described above, the energy interval between the two emission upper levels increase. That is, when the layer thickness of the well layer 161 is designed to be 3.1 nm, the two levels are most strongly coupled.

Further, as shown by the graph of FIG. 11, when the layer thickness of the well layer 161 is changed in the same manner, it is found that emissions are obtained with intensities substantially equal to each other from the respective first and second emission upper levels $L_{up1}$ and $L_{up2}$ at the layer thickness of 3.1 nm of the configuration example described above. In the quantum cascade laser configured as described above, the quantum well structure in the unit laminate structure 16 and corresponding subband level structure are preferably designed so that the energy interval $\Delta E_{43}$ between the two emission upper levels is properly designed to be and sufficient transition intensities are obtained in transitions from both the two upper levels to the emission lower level.

Here, the actual emission intensity from the quantum cascade laser is determined by the square of the dipole moment (square of the transition intensity) and the emission energy. When $\Delta E_{43}$=15 meV as the design state of the configuration example described above, if the ratio of the squares of transition intensities (ratio of emission intensities) becomes larger than 5 to 1, one emission intensity is weak, so that the emission half width as a whole cannot be broadened. Considering these conditions, the layer thickness of the first well layer 161 in the configuration example described above is preferably designed to be in the range shown by R1 and R2 respectively in FIG. 10 and FIG. 11.

Figure 12:
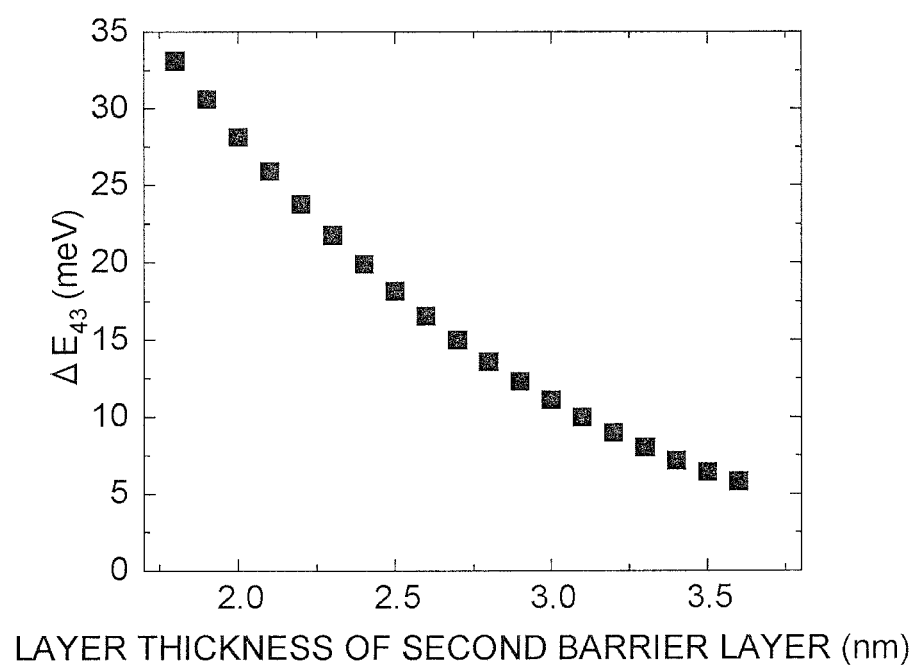
FIG. 12 is a graph showing dependence of an energy interval between the first emission upper level and the second emission upper level on the layer thickness of the second barrier layer.

FIG. 12 is a graph showing dependence of the energy interval between the first emission upper level $L_{up1}$ and the second emission upper level $L_{up2}$ on the layer thickness of the second barrier layer. In this graph, the horizontal axis indicates the layer thickness of the second barrier layer 172 (nm) in the emission layer 17, and the vertical axis indicates the energy interval $\Delta E_{43}$ (meV) between the first and second emission upper levels.

In the configuration example shown in FIG. 5 and FIG. 6, the layer thickness of the second barrier layer 172 of the emission layer 17 is 2.7 nm. On the other hand, as shown by the graph of FIG. 12, when the layer thickness of the barrier layer 172 is changed, the anticrossing of the two levels which provides the energy difference $\Delta E_{43}$ changes. This is also important for regulating the structure of the above-described quantum cascade laser. In the example shown in FIG. 12, the layer thickness of the second barrier layer 172 is preferably designed to be thicker than 1.8 nm with which $\Delta E_{43}$ becomes not less than the energy of an LO phonon and thinner than the injection barrier layer as a barrier layer thickest in the unit laminate structure 16.

As described above, in the configuration with two emission upper levels, it is important that the layer thickness of the second barrier layer 172 determined as described above, and the layer thickness of the first well layer 161 for providing sufficient transition intensities from the two upper levels to the lower level, are properly designed. An allowable range of the layer thickness of the first well layer 161 for satisfying preferred configuration conditions always changes depending on the layer thickness of the second barrier layer 172, and the allowable range tends to become larger as the second barrier layer 172 becomes thinner, and become smaller as the second barrier layer becomes thicker. In the configuration example described above in which the emission wavelength is designed to be 8.7 µm, the allowable range is within approximately ±2 to 3 atomic layers (0.4 to 1.0 nm) from the layer thickness with which the two upper levels provide dipole moments substantially equal to each other. However, this condition differs depending on the specific configuration of the emission energy and semiconductor material system, etc.

Figure 13:
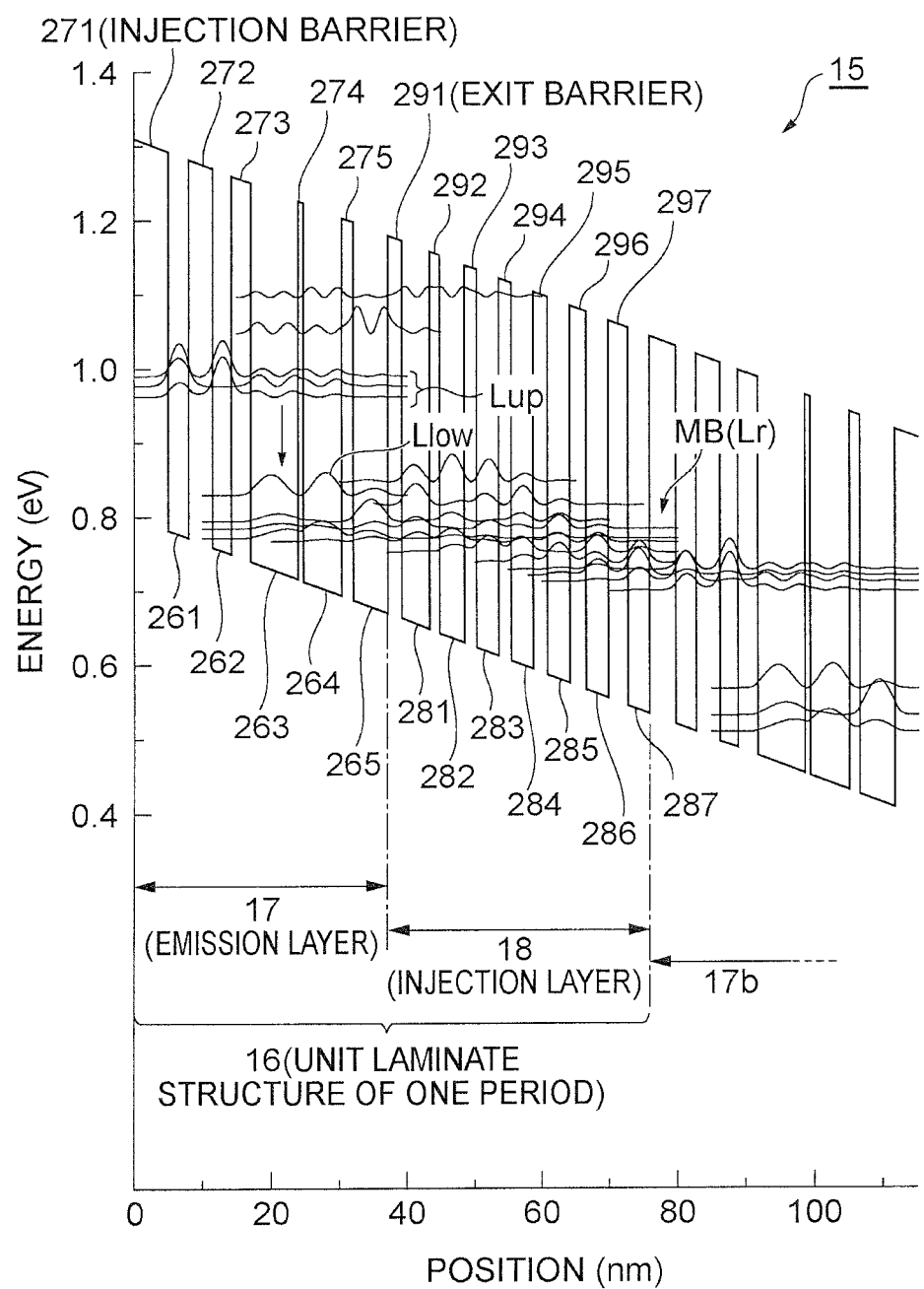
FIG. 13 is a diagram showing another example of a configuration of a unit laminate structure constituting the active layer.

The configuration of the quantum cascade laser of the present invention will be further described along with another specific example. FIG. 13 is a diagram showing another example of a configuration of the unit laminate structure constituting the active layer in the quantum cascade laser. FIG. 14 shows a detailed structure of the unit laminate structure of one period in the active layer 15 shown in FIG. 13. The configuration shown in FIG. 13 and FIG. 14 corresponds to a modification example of the configuration shown in FIG. 5 and FIG. 6.

In this configuration example, the unit laminate structure 16 of one period is configured as a quantum well structure formed by alternately laminating twelve quantum well layers 261 to 265 and 281 to 287 and twelve quantum barrier layers 271 to 275 and 291 to 297 as shown in FIG. 13. In the lamination structure shown in FIG. 13, the lamination portion consisting of five well layers 261 to 265 and barrier layers 271 to 275 mainly functions as the emission layer 17. The lamination portion consisting of seven well layers 281 to 287 and barrier layers 291 to 297 mainly functions as the injection layer 18.

In this configuration, the unit laminate structure 16 has, in its subband level structure, three emission upper levels $L_{up}$, an emission lower level $L_{low}$, and a relaxation miniband MB as a relaxation level. That is, in the structure shown in FIG. 13, by adding a well layer and a barrier layer in the emission layer 17, a level structure in which the emission upper level is formed as an upper miniband consisting of three levels of first, second, and third emission upper levels is realized.

Thus, a configuration in which three or more levels including at least first and second emission upper levels are provided as emission upper levels in the subband level structure of the unit laminate structure 16 is also possible. In this configuration, the conditions of the energy intervals, forms of wave functions, and transition intensities of the levels can be controlled by the layer thicknesses of the quantum well layers and barrier layers constituting the emission layer 17.

Further, in the configuration in which the emission upper levels include two or three or more levels, as described above, concerning emission intensities of intersubband transitions from the plurality of emission upper levels, the weakest emission preferably has an emission intensity not less than 1/5 of that of the most intense emission. The energy width of the whole of the plurality of emission upper levels is preferably designed to be smaller than the energy of an LO phonon.

In addition, electrons from the relaxation level of the injection layer of the preceding stage are preferably injected into energy levels except for the lowest energy level among the plurality of emission upper levels. In detail, when two levels of the first and second emission upper levels are provided in order from the lower energy side as emission upper levels, electrons are preferably injected into the second emission upper level on the higher energy side. When three levels of first, second, and third emission upper levels are provided in order from the lower energy side, electrons are preferably injected into the third emission upper level on the highest energy side or the middle second emission upper level.

In the configuration example shown in FIG. 13 and FIG. 14, specifically, dipole moments of emission transitions from the three emission upper levels $L_{up}$ to the emission lower level $L_{low}$, are 1.24 nm, 1.53 nm, and 1.26 nm in order from the higher energy level side, and from the respective upper levels, large transition intensities necessary and sufficient for providing a broad gain spectrum are obtained. The energies of emission transitions from the respective emission upper levels to the emission lower level are 134.3 meV, 147.5 meV, and 158.4 meV, respectively, and the energy width of the upper miniband consisting of these three levels is 24.1 meV.

The quantum cascade laser of the present invention is not limited to the above-described embodiments and configuration examples, and can be modified in many ways. For example, in the configuration example described above, an InP substrate is used as a semiconductor substrate, and the active layer is made of InGaAs/InAlAs, however, specifically, various configurations may be used as long as the emission transitions by intersubband transitions are possible in the quantum well structure and the above-described subband level structure can be realized.

As the semiconductor material system, in addition to the above-described InGaAs/InAlAs, various material systems such as, for example, GaAs/AlGaAs, InAs/AlSb, GaN/AlGaN, and SiGe/Si, etc., can be used. As the crystal growth method of the semiconductor, various methods can be used.

As the lamination structure in the active layer of the quantum cascade laser and the semiconductor lamination structure as the whole laser element, in addition to the structures shown in FIG. 4 to FIG. 6, FIG. 13, and FIG. 14, various structures can be used. Generally, the quantum cascade laser is required to include a semiconductor substrate and an active layer configured as described above and provided on the semiconductor substrate. Further, in the above-described configuration example, a configuration lattice-matched to the InP substrate is described, however, for example, a configuration introducing lattice mismatch to the InP substrate is also usable. In this case, an increase in the degree of freedom of element design, efficient carrier confinement, and a shorter oscillation wavelength can be realized.

The quantum cascade laser according to the embodiment described above includes (1) a semiconductor substrate and (2) an active layer provided on the semiconductor substrate and with a cascade structure formed by alternately laminating quantum well emission layers and injection layers by multistage-laminating unit laminate structures each including the quantum well emission layer and the injection layer, and is configured so that (3) the unit laminate structure included in the active layer has, in its subband level structure, a first emission upper level, a second emission upper level as an energy level higher than the first emission upper level, a single emission lower level, and a relaxation level as an energy level lower than the emission lower level, (4) light is generated by intersubband transitions of electrons from the first emission upper level and the second emission upper level to the emission lower level in the quantum well emission layer, and electrons after the intersubband transitions are relaxed from the emission lower level to the relaxation level, and injected from the injection layer into the quantum well emission layer of the unit laminate structure of the subsequent stage via the relaxation level.

Here, concerning extraction of electrons from the emission lower level, in the unit laminate structure, electrons after intersubband transitions are preferably relaxed from the emission lower level to the relaxation level by longitudinal optical (LO) phonon scattering. Thus, in the configuration in which the energy difference between the emission lower level and the relaxation level is designed to correspond to the energy of an LO phonon, electrons after emission transitions between subbands in the emission layer are extracted at a high speed from the emission lower level via LO phonon scattering. Therefore, efficient formation of an inverted population in the emission layer and a corresponding reduction in the threshold of the laser operation can be realized.

Alternatively, a configuration is also usable in which the unit laminate structure included in the active layer has, in its subband level structure, a relaxation miniband functioning as the relaxation level, and in the unit laminate structure, electrons after intersubband transitions are relaxed from the emission lower level to the relaxation miniband by longitudinal optical phonon scattering, and injected from the injection layer to the quantum well emission layer of the unit laminate structure of the subsequent stage via the relaxation miniband.

In the above-described configuration, in the subband level structure of the unit laminate structure, a relaxation miniband consisting of energy levels lower than the emission lower level is provided. The level structure is configured so that the energy difference between the emission lower level and the relaxation miniband corresponds to the energy of an LO phonon. In this configuration, electrons after emission transitions between subbands in the emission layer are extracted at a high speed from the emission lower level via LO phonon scattering and relaxation in the miniband. Therefore, efficient formation of an inverted population in the emission layer and a corresponding reduction in the threshold of the laser operation can be realized, and the laser operation performance can be particularly improved.

By using the miniband for relaxation of electrons after intersubband transitions, the design of the electron relaxation structure from the emission lower level is made easy, and stable characteristics in manufacturing of the laser device and improvement in yield can be realized.

As to the emission upper level in the subband level structure of the unit laminate structure, more generally, a configuration can be adopted in which a plurality (two or three or more) of emission upper levels including at least the first emission upper level and the second emission upper level are provided. In this configuration, concerning emission intensities of intersubband transitions from the plurality of emission upper levels to the emission lower level, the weakest emission preferably has an emission intensity not less than 1/5 of that of the most intense emission. In this case, the plurality of emission upper levels behave like one emission upper level with an energy range as a whole. Accordingly, in emission output from the quantum cascade laser, a homogeneously spread emission spectrum can be obtained.

It is preferable that the unit laminate structure included in the active layer has, in its subband level structure, a plurality of emission upper levels including at least the first emission upper level and the second emission upper level, and the energy width of the whole of the plurality of emission upper levels is designed to be smaller than the energy of an LO phonon. Accordingly, in emission transitions from the plurality of emission upper levels to the emission lower level, excellent characteristics are obtained. When the plurality of emission upper levels are two levels of the first and second emission upper levels, the above described condition corresponds to designing of the energy interval between these two levels to be smaller than the energy of an LO phonon.

It is preferable that the unit laminate structure included in the active layer has, in its subband level structure, a plurality of emission upper levels including at least the first emission upper level and the second emission upper level, and electrons from the relaxation level of the injection layer of the preceding stage are injected into energy levels except for the lowest energy level among the plurality of emission upper levels. Accordingly, the energy dependence of a carrier distribution in an upper miniband consisting of the plurality of emission upper levels can be uniformized.

The present invention is applicable as a quantum cascade laser capable of preferably obtaining emission in a broad wavelength range.

What is claimed is:

1. A quantum cascade laser comprising:
    a semiconductor substrate; and
    an active layer which is provided on the semiconductor substrate and has a cascade structure formed by alternately laminating quantum well emission layers and injection layers by multistage-laminating unit laminate structures each including the quantum well emission layer and the injection layer, wherein
    the unit laminate structure included in the active layer has, in its subband level structure, a first emission upper level, a second emission upper level as an energy level higher than the first emission upper level, a single emission lower level, and a relaxation level as an energy level lower than the emission lower level,
    the first emission upper level, the second emission upper level, and the emission lower level relating to emission are energy levels in the quantum well emission layer,
    the quantum well emission layer includes at least, from the side of the injection layer of the preceding stage, a first barrier layer, a first well layer, a second barrier layer, and a second well layer, and the first well layer has a layer thickness that is thinner than other well layers in the quantum well emission layer so that a ground level of the first well layer, when the first well layer is present as a single quantum well layer, is the second emission upper level of the quantum well emission layer,
    the first barrier layer is an injection barrier layer being a barrier layer thickest in the unit laminate structure, the second barrier layer has a layer thickness that is thicker than 1.8 nm and thinner than the injection barrier layer,
    wave functions of the first and second emission upper levels are coupled under conditions of the operating electric field, and these emission upper levels behave like one emission upper level with an energy width,
    light is generated by intersubband transitions of electrons from the first emission upper level and the second emission upper level to the emission lower level in the quantum well emission layer, and electrons after the intersubband transitions are relaxed from the emission lower level to the relaxation level, and injected from the injection layer into the quantum well emission layer of the unit laminate structure of the subsequent stage via the relaxation level, and wherein
    the unit laminate structure included in the active layer has, in its subband level structure, a plurality of emission upper levels including at least the first emission upper level and the second emission upper level,
    concerning emission intensities of intersubband transitions from the plurality of emission upper levels to the emission lower level, the weakest emission has an emission intensity not less than 1/5 of that of the most intense emission, and
    an energy width of the whole of the plurality of emission upper levels is designed to be smaller than the energy of the longitudinal optical phonon.

2. The quantum cascade laser according to claim 1, wherein
    electrons from the relaxation level of the injection layer of the preceding stage are injected into energy levels except for the lowest energy level among the plurality of emission upper levels.

3. The quantum cascade laser according to claim 1, wherein in the unit laminate structure, electrons after the intersubband transitions are relaxed from the emission lower level to the relaxation level by longitudinal optical phonon scattering.

4. The quantum cascade laser according to claim 1, wherein
    the unit laminate structure included in the active layer has, in its subband level structure, a relaxation miniband functioning as the relaxation level, and
    in the unit laminate structure, electrons after the intersubband transitions are relaxed from the emission lower level to the relaxation miniband by longitudinal optical phonon scattering, and injected from the injection layer into the quantum well emission layer of the unit laminate structure of the subsequent stage via the relaxation miniband.

* * * * *